(12) United States Patent
Halbritter et al.

(10) Patent No.: US 12,106,980 B2
(45) Date of Patent: Oct. 1, 2024

(54) ADHESIVE TRANSFER STAMP AND METHOD FOR TRANSFERRING A SEMICONDUCTOR CHIP USING AN ADHESIVE TRANSFER STAMP

(71) Applicant: OSRAM Opto Semiconductors GmbH, Regensburg (DE)

(72) Inventors: Hubert Halbritter, Dietfurt-Toeging (DE); Alexander Pfeuffer, Regensburg (DE); Mikko Peraelae, Tampere (FI)

(73) Assignee: OSRAM Opto Semiconductors GmbH, Regensburg (DE)

(*) Notice: Subject to any disclaimer, the term of this patent is extended or adjusted under 35 U.S.C. 154(b) by 542 days.

(21) Appl. No.: 17/604,977

(22) PCT Filed: Jul. 22, 2019

(86) PCT No.: PCT/EP2019/069687
§ 371 (c)(1),
(2) Date: Oct. 19, 2021

(87) PCT Pub. No.: WO2021/013332
PCT Pub. Date: Jan. 28, 2021

(65) Prior Publication Data
US 2022/0216076 A1  Jul. 7, 2022

(51) Int. Cl.
*H01L 21/67* (2006.01)
*H01L 21/683* (2006.01)
(52) U.S. Cl.
CPC .. *H01L 21/67132* (2013.01); *H01L 21/67144* (2013.01); *H01L 21/683* (2013.01)

(58) Field of Classification Search
CPC .......................... H01L 21/7132; H01L 21/683
See application file for complete search history.

(56) References Cited

U.S. PATENT DOCUMENTS 6,386,432 B1    5/2002  Jin et al.
7,427,782 B2 *  9/2008  Daniels ............. B32B 17/10036
                                                  257/443
(Continued)

FOREIGN PATENT DOCUMENTS

DE    102019106546 A1 *  9/2020  ......... H01L 25/0753
KR      20080071267 A     8/2008
(Continued)

OTHER PUBLICATIONS

M. Brogly "Forces Involved in Adhesion" Springer International Publishing AG 2017 (Year: 2017).*

(Continued)

*Primary Examiner* — Matthew J Daniels
*Assistant Examiner* — Wayne K. Swier
(74) *Attorney, Agent, or Firm* — Slater Matsil, LLP

(57) ABSTRACT

In an embodiment an adhesive transfer stamp for transferring semiconductor chips includes a volume region including an electrically insulating material, at least one adhesive surface configured to receive a semiconductor chip and an electrically conductive element configured to electrically conductively connected to a ground conductor during operation and to dissipate electrical charges from the semiconductor chip to the ground conductor, wherein the volume region is embodied as a solid body, and wherein the volume region has at least one stepped structure.

19 Claims, 5 Drawing Sheets

(56) References Cited

U.S. PATENT DOCUMENTS

2003/0209847 A1 11/2003 Allison et al.
2008/0203545 A1 8/2008 Kato

FOREIGN PATENT DOCUMENTS

| KR | 20080075609 A | | 8/2008 | |
|----|---------------|---|--------|---|
| KR | 20100034936 A | | 4/2010 | |
| KR | 2018018865 A | * | 2/2018 | ............. H01L 21/00 |

OTHER PUBLICATIONS

Virtusa digital themes glossary—image recognition May 13, 2021 www.virtusa.com/digital-themes/image-recognition (Year: 2021).*
Machine translation KR20180018865A (Year: 2018).*
Machine translation DE102019106546A1 (Year: 2020).*
Display Daily, "The Only Disruptive Technology at Display Week," (/article/display-daily/the-only-disruptive-techonology-at-display-week), MicroLED, vol. 22, Issue 30, 4 pages.

* cited by examiner

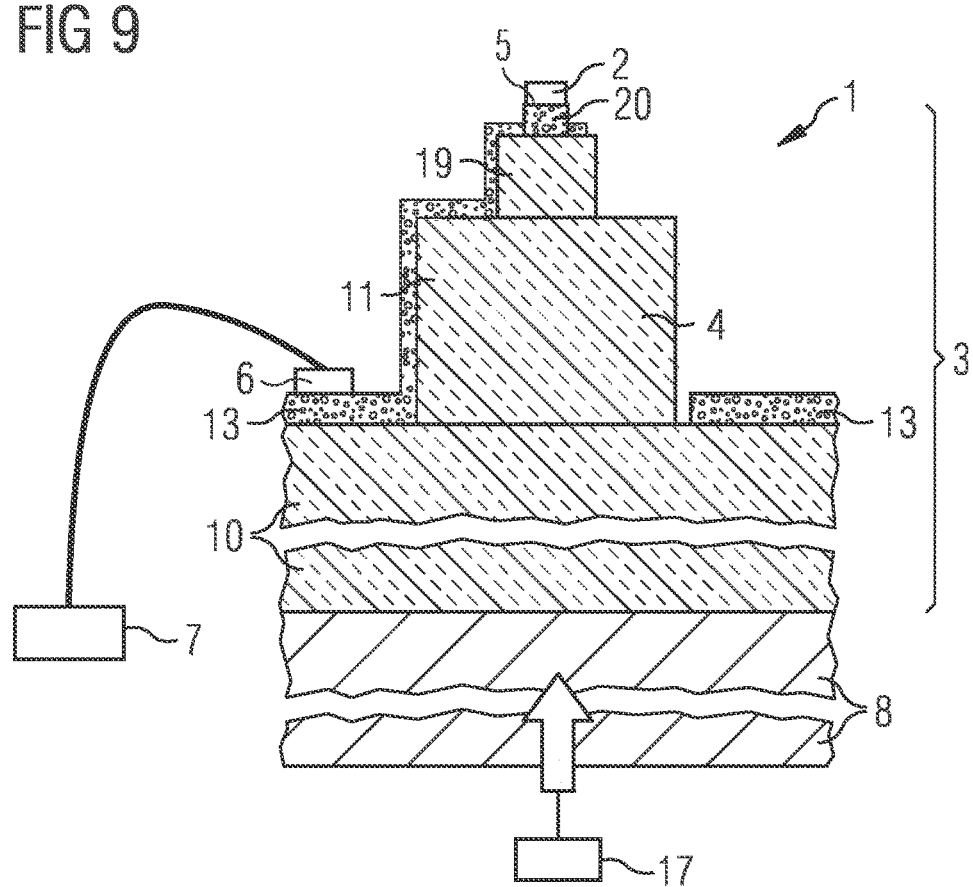

ADHESIVE TRANSFER STAMP AND METHOD FOR TRANSFERRING A SEMICONDUCTOR CHIP USING AN ADHESIVE TRANSFER STAMP

This patent application is a national phase filing under section 371 of PCT/EP2019/069687, filed Jul. 22, 2019, which is incorporated herein by reference in its entirety.

TECHNICAL FIELD

An adhesive transfer stamp is specified. Further, a method for transferring a semiconductor chip using an adhesive transfer stamp is specified.

SUMMARY

Embodiments provide an adhesive transfer stamp that is protected against electrostatic discharges. Moreover, further embodiments provide a method for transferring a semiconductor chip using an adhesive transfer stamp.

In accordance with at least one embodiment, the adhesive transfer stamp comprises a volume region comprising an electrically insulating material or formed from an electrically insulating material. Electrically insulating materials generally have a high electrical resistivity. In general the volume region is embodied as a three-dimensional volume. Particularly preferably, the volume region is embodied as a solid body which, particularly preferably, is free of air inclusions. Preferably, the volume region of the adhesive transfer stamp is embodied in flexible fashion, particularly preferably in elastic fashion. Particularly preferably, the volume region reverts completely to an initial shape in the event of a deformation on account of a mechanical force.

In accordance with a further embodiment, the adhesive transfer stamp has at least one adhesive surface configured and provided for receiving a semiconductor chip. By way of example, the adhesive surface is formed by an outer surface of the volume region. By way of example, the adhesive transfer stamp comprises a multiplicity of adhesive surfaces arranged parallel to one another.

The adhesive surface can be embodied as a round, for example circular, planar surface or as a rectangular, planar surface. A dimension of the adhesive surface, such as a diameter or an edge length, is preferably between 3 micrometers and 300 micrometers inclusive.

In accordance with one embodiment, the adhesive transfer stamp has a rectangular basic shape. In this case, the adhesive surface and preferably an underside of the adhesive transfer stamp, situated opposite the adhesive surface, are embodied in rectangular fashion.

In accordance with at least one embodiment, the adhesive transfer stamp comprises an electrically conductive element, which is provided for being electrically conductively connected to a ground conductor during operation and is configured to dissipate electrical charges from the semiconductor chip to a ground conductor. The electrically conductive element is generally connected to ground potential for the purpose of electrostatic discharge.

In accordance with at least one embodiment, the adhesive transfer stamp for transferring semiconductor chips comprises a volume region comprising an electrically insulating material. In addition, the adhesive transfer stamp for transferring semiconductor chips comprises an adhesive surface for receiving a semiconductor chip, and an electrically conductive element, which is provided for being electrically conductively connected to a ground conductor during operation and is configured to dissipate electrical charge from the semiconductor chip to the ground conductor.

One concept of the adhesive transfer stamp for transferring semiconductor chips described here is, inter alia, that of providing an electrically conductive element connected to a ground conductor during operation of the adhesive transfer stamp, such that electrostatic charges on the adhesive transfer stamp and/or the component to be transferred flow away to the ground conductor. This prevents a high electrostatic charge from accumulating on the adhesive transfer stamp. This advantageously results in a partial or complete suppression of ESD pulses (ESD stands for "electrostatic discharge"), such that damage to the component to be transferred can advantageously be prevented. Moreover, an optical alignment with the aid of a camera system through the transparent adhesive transfer stamp is advantageously possible in some embodiments.

In accordance with at least one embodiment, the adhesive transfer stamp comprises an electrically conductive element comprising a transparent conductive oxide (TCO) or a metal or formed from a TCO or a metal.

In general TCO compounds are metal oxides such as, for example, indium tin oxide, zinc oxide, tin oxide, cadmium oxide, titanium oxide or indium oxide. Besides binary oxygen-metal compounds, ternary metal-oxygen compounds such as, for example, $Zn_2SO_4$, $ZnSnO_3$, $MgIn_2O_4$, $GaInO_3$ or mixtures of different transparent conductive oxides also belong to the group of TCOs. The TCOs can furthermore also be p- and n-doped.

As metal, for example, it is possible to use one of the following materials for the electrically conductive element: titanium, silver, copper, gold, aluminum, iron, tungsten, platinum.

In accordance with a further embodiment, an adhesion promoting layer is arranged between the electrically conductive element and the volume region. Preferably, the adhesion promoting layer is in direct contact with the volume region and in direct contact with the electrically conductive element. The adhesion promoting layer advantageously improves the adhesion of the electrically conductive element to the volume region. By way of example, the adhesion promoting layer comprises titanium or a titanium-tungsten alloy or is formed from one of these materials. By way of example, the adhesion promoting layer is embodied as a monolayer.

In accordance with at least one embodiment, the volume region of the adhesive transfer stamp comprises a transparent electrically insulating material or is formed from a transparent electrically insulating material. In the present case, the term "transparent" means that an element designated in this way is transmissive to at least 80%, preferably to at least 85%, and particularly preferably to at least 90%, of incident electromagnetic radiation in a certain wavelength range. Particularly preferably, the volume region is transparent to visible light.

Moreover, the volume region is particularly preferably embodied in elastic fashion.

By way of example, the volume region comprises a polymer or is formed from a polymer. Preferably, the volume region comprises an elastomer or is formed from an elastomer. Particularly preferably, the volume region comprises a silicone or is formed from a silicone. By way of example, the adhesive transfer stamp comprises polydimethylsiloxane (PDMS) or is formed from PDMS. PDMS is generally transparent and chemically inert and has a high elasticity.

In accordance with at least one embodiment, the adhesive transfer stamp has a carrier. The carrier is preferably embodied in rigid fashion. The volume region is preferably arranged on a main surface of the carrier, preferably in direct contact. Particularly preferably, the carrier is embodied in transparent fashion, preferably to visible light. By way of example, the carrier comprises glass, crystalline sapphire or a plastic or is formed from one of these materials. With the aid of a camera system, the semiconductor chip can advantageously be optically aligned through the transparent carrier. A thickness of the carrier is preferably between 3 millimeters and 5 millimeters inclusive.

In accordance with at least one embodiment, the volume region has at least one stepped structure. The individual steps can each have a different height. Hereinafter three different layers and a base are described as part of the stepped structure. It should be pointed out at this juncture, however, that the stepped structure can also have more or fewer layers. The carrier comprises at least one stepped structure, wherein for example each stepped structure has an adhesive surface. The stepped structures are preferably arranged parallel to one another.

In accordance with at least one further embodiment, the stepped structure comprises a base and a first layer having a cross-sectional area which is preferably smaller than the cross-sectional area of the base. The two cross-sectional areas are preferably arranged parallel to a main surface of the carrier. A height of the base has for example a value of between 1 millimeter and 10 millimeters inclusive. A height of the first layer has for example a value of between 10 micrometers and 100 micrometers inclusive.

In accordance with a further embodiment, the stepped structure has a second layer. The second layer is preferably arranged in direct contact with the first layer and preferably has a cross-sectional area which is smaller than the cross-sectional area of the first layer. A height of the second layer has for example a value of between 10 micrometers and 100 micrometers inclusive.

In accordance with a further embodiment, the stepped structure has a third layer. The third layer is preferably arranged in direct contact with the second layer and preferably has a cross-sectional area which is smaller than the cross-sectional area of the second layer. A height of the third layer has for example a value of between 5 micrometers and 20 micrometers inclusive.

In accordance with at least one embodiment, the electrically conductive element is embodied as an electrically conductive layer. The electrically conductive layer can be arranged completely or partly on a surface of the volume region of the adhesive transfer stamp. By way of example, the electrically conductive layer has a thickness of between 50 nanometers and 5 micrometers inclusive.

The electrically conductive layer can be formed from a metal or a TCO or can comprise one of these materials. Moreover, it is possible for the electrically conductive layer to comprise the electrically insulating material, for instance a polymer such as PDMS, into which electrically conductive particles are introduced.

In accordance with one embodiment, the volume region has a stepped structure, wherein the electrically conductive layer is arranged only on a surface of the base, while the remaining surface of the volume region is free of the electrically conductive layer. In general the base has a significantly larger surface area than the rest of the stepped structure, such that in this way a very large part of the surface of the volume region is covered with the electrically conductive layer and at the same time an optical alignment can be effected through an underside of the adhesive transfer stamp, situated opposite the adhesive surface.

In accordance with a further embodiment, side surfaces of the volume region that are arranged between the adhesive surface and the underside are covered with the electrically conductive layer at least in places. If the volume region has a stepped structure, then side surfaces of the first layer, of the second layer and/or of the third layer can be covered with the electrically conductive layer in addition to a top side of the base. Particularly preferably, in this case, at least one side surface of the volume region is free of the electrically conductive layer. In this case, the top side of the base is preferably arranged parallel to the underside. The area coverage of the volume region with the electrically conductive layer is advantageously increased in this way.

In accordance with a further embodiment, the entire surface of the volume region, apart from a rear-side main surface that is situated opposite the adhesive surface and is optionally applied to the carrier, is covered with the electrically conductive layer. In particular, in this embodiment, the adhesive surface is formed by the electrically conductive layer.

In accordance with at least one embodiment, the electrically conductive element is embodied as an electrically conductive layer arranged at least partly within the volume region of the adhesive transfer stamp. By way of example, the electrically conductive layer extends vertically from the base to the adhesive surface within the volume region and furthermore horizontally at the top side of the base.

In accordance with at least one embodiment, the electrically conductive element is embodied as an electrical contact. In this case, the electrical contact is freely accessible externally and can be electrically conductively connected to the ground conductor. In this embodiment, the volume region of the adhesive transfer stamp particularly preferably comprises a multiplicity of electrically conductive particles. Particularly preferably, the volume region is formed from an electrically insulating polymer, into which the particles are introduced. The electrically conductive particles are preferably completely embedded into the polymer and distributed in the polymer.

The electrically conductive particles can comprise one of the following materials or consist of one of the following materials: graphite or a metal.

By way of example, the electrically conductive particles have a diameter of between 100 nanometers and 500 nanometers inclusive. A degree of filling of the electrically conductive particles in the polymer is preferably between 10% by weight and 50% by weight inclusive.

In accordance with one embodiment, the entire volume region is provided with electrically conductive particles.

In accordance with a further embodiment, the volume region has a stepped structure, wherein only the base comprises a multiplicity of electrically conductive particles. The electrically conductive particles are distributed for example over the entire region of the base. The rest of the volume region, that is to say for example the first, second and/or third layer, is preferably free of electrically conductive particles in this embodiment.

In accordance with at least one embodiment, the electrically conductive particles are contained only in parts of the volume region. By way of example, a core of the volume region is embodied in electrically insulating fashion, while an edge region is provided with electrically conductive particles. By way of example, the edge region has a thickness of between 10 micrometers and 100 micrometers inclusive. This embodiment has the advantage that with the use of a transparent polymer for the volume region, the core is transparent and permits an alignment using a camera system.

If the volume region has a base, then the base can have a core embodied in electrically insulating fashion. In this case, the core is preferably surrounded by an edge region that preferably completely surrounds the core laterally. The edge region is preferably provided with electrically conductive particles.

In accordance with a further embodiment, the adhesive transfer stamp has a multiplicity of adhesive surfaces arranged next to one another, preferably in a common plane. Particularly preferably, the adhesive surfaces are embodied in identical fashion in this case.

In accordance with a further embodiment, the adhesive transfer stamp has a multiplicity of stepped structures arranged next to one another, likewise preferably in a plane. Particularly preferably, the stepped structures are embodied in identical fashion in this case, in particular with regard to number and height of their layers.

The adhesive transfer stamp described here can be used in a method for transferring semiconductor chips. All features described in association with the adhesive transfer stamp can also be embodied in the method, and vice versa.

In accordance with at least one embodiment of the method for transferring a semiconductor chip, a semiconductor chip is adhesively attached to the adhesive surface of the adhesive transfer stamp.

The adhesive transfer stamp is preferably aligned with the semiconductor chip with the aid of a camera system.

By way of example, the semiconductor chip is an optoelectronic semiconductor chip such as a light emitting diode chip.

An optoelectronic semiconductor chip, such as a light emitting diode chip, for example, generally has an epitaxially grown semiconductor layer sequence with an active zone suitable for detecting or generating electromagnetic radiation. For this purpose, the active zone comprises for example a pn junction, a double heterostructure, a single quantum well or particularly preferably a multiple quantum well structure. Such structures are particularly sensitive vis á vis electrostatic discharges, in particular, and so the transfer of such semiconductor chips using the adhesive transfer stamp described here is particularly advantageous.

The method for transferring a semiconductor chip described here is suitable in particular for comparatively small semiconductor chips that can be handled only with difficulty using conventional pick-and-place devices. The semiconductor chip has for example an edge length of between 3 micrometers and 300 micrometers inclusive. In particular, the present method is suitable for transferring semiconductor chips having an edge length that is not greater than 50 micrometers.

In accordance with at least one embodiment, the semiconductor chip on the adhesive transfer stamp is positioned on a mounting surface of a connection carrier.

In accordance with at least one embodiment of the method for transferring a semiconductor chip, the adhesive transfer stamp is released from the semiconductor chip by shear forces. By means of a slow shear movement, in particular, the semiconductor chips can be peeled off from the elastic adhesive surface of the adhesive transfer stamp and remain on the mounting surface.

In accordance with at least one embodiment of the method, a semiconductor chip is adhesively attached to the adhesive surface by way of van der Waals forces.

In accordance with at least one embodiment of the method, the semiconductor chip is positioned on the mounting surface with the aid of a camera system with automatic image recognition. In this case, the camera system is preferably arranged at an underside of the transparent carrier, situated opposite the adhesive surface.

In accordance with at least one embodiment of the method, the semiconductor chip is peeled off from the adhesive transfer stamp by shear movements, wherein the semiconductor chip remains on the mounting surface. The shear movement is preferably achieved by means of a horizontal movement of the adhesive transfer stamp, which is affected along the main surface of the carrier. By virtue of a slow shear movement, the semiconductor chips are advantageously not damaged and not moved concomitantly with the adhesive transfer stamp.

By way of example, the method for transferring semiconductor chips using an adhesive transfer stamp is affected as follows:

In a first step, the adhesive transfer stamp picks up the semiconductor chip and transfers it from a delivery wafer to a mounting surface of a connection carrier. The adhesive surface of the adhesive transfer stamp is preferably cleaned.

In a next step, the adhesive surface of the adhesive transfer stamp is brought into contact with the semiconductor chip to be transferred. This is done by the adhesive transfer stamp being led to the delivery wafer. The semiconductor chip is bonded to the adhesive surface of the adhesive transfer stamp and can be aligned with the aid of the camera system in such a way that it can be detached from the delivery wafer in a targeted manner. Rapid movement of the adhesive transfer stamp away in a vertical direction achieves the effect that the semiconductor chip still adheres to the adhesive surface of the adhesive transfer stamp. The rapid movement away is affected by a rapid movement of the adhesive transfer stamp with the semiconductor chip to be transferred away from the delivery wafer.

The semiconductor chip on the adhesive surface is positioned on a mounting surface of a connection carrier. The semiconductor chip is positioned on the mounting surface with the aid of the camera system with automatic image recognition. After positioning, in a next step, the adhesive transfer stamp with the semiconductor chip to be transferred moves in a vertical direction toward the mounting surface of the connection carrier and is placed on the mounting surface. A planarizing dielectric can be applied to the mounting surface, which dielectric results in a successful placement of the semiconductor chip onto the mounting surface of the connection carrier.

By means of a slow shear movement, the semiconductor chip can be peeled off from the elastic adhesive transfer stamp, without the semiconductor chip becoming detached again from the mounting surface. The slow shear movement has the effect that the semiconductor chip is not damaged and is not moved concomitantly with the adhesive transfer stamp.

In a last step, the adhesive transfer stamp moves away again from the mounting surface of the connection carrier. The adhesive transfer stamp can then be prepared for the further transfer of semiconductor chips by means of subsequent cleaning of the connection surface.

BRIEF DESCRIPTION OF THE DRAWINGS

The adhesive transfer stamp is explained in greater detail below on the basis of exemplary embodiments and the associated figures.

FIGS. 1 to 9 each show a schematic sectional illustration of an adhesive transfer stamp in accordance with a respective exemplary embodiment.

DETAILED DESCRIPTION OF ILLUSTRATIVE EMBODIMENTS

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated size in order to enable better illustration and/or in order to afford a better understanding.

Figure 1:
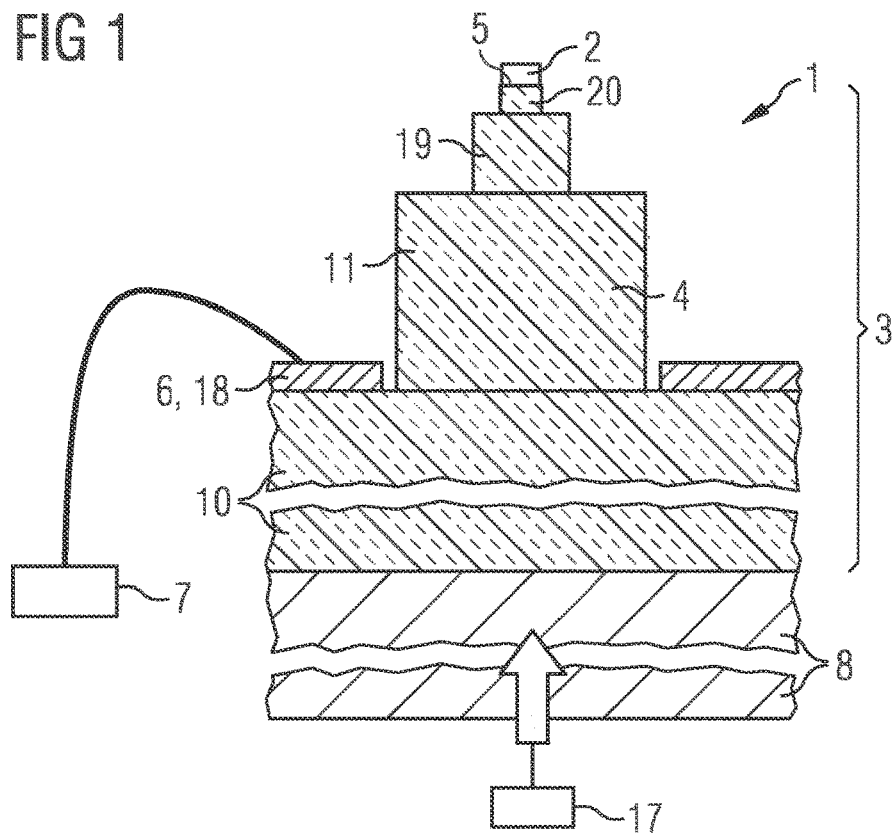

The adhesive transfer stamp 1 in accordance with the exemplary embodiment in FIG. 1 has a volume region 3 with a stepped structure. The volume region 3 is arranged in direct contact on a main surface of a rigid carrier 8. The carrier 8 is preferably embodied such that it is transparent to electromagnetic radiation, in particular to visible light. By way of example, the transparent carrier 8 is a glass carrier.

The adhesive transfer stamp 1 has an adhesive surface 5 provided and configured for receiving a semiconductor chip 2. The adhesive surface 5 is situated opposite an underside of the adhesive transfer stamp 1. The semiconductor chip 2 adheres on the adhesive surface 5 on account of van der Waals forces.

In the present case, the volume region 3 is formed from a transparent, electrically insulating and elastic material 4. By way of example, a transparent elastomer, such as PDMS, is suitable as material for the adhesive transfer stamp L In the present exemplary embodiment, the adhesive surface 5 is formed by a region of an outer surface of the volume region 3 and thus from the electrically insulating material 4.

In the present case, the stepped structure of the volume region 3 has a base 10, a first layer 11, a second layer 19 and a third layer 20. The first layer 11 is applied to the base 10, the second layer 19 is applied to the first layer 11, and the third layer 20 is applied to the second layer 19. In this case, the first layer 11 has a cross-sectional area which is smaller than a cross-sectional area of the base 10, while a cross-sectional area of the second layer 19 is smaller than the cross-sectional area of the first layer 11. Finally, a cross-sectional area of the third layer 20 is smaller than the cross-sectional area of the second layer 19. The base 10, the first layer 11, the second layer 19 and the third layer 20 are stacked one above another centrally in each case, such that side surfaces of the volume region 3 that are arranged between the adhesive surface 5 and the underside are embodied in stepped fashion.

Furthermore, the adhesive transfer stamp comprises an electrically conductive element 6, which is electrically conductively connected to a ground conductor 7 in the present case. In this regard, electrical charges can flow away from a semiconductor chip 2 on the adhesive surface 5 of the adhesive transfer stamp 1 via the electrically conductive element 6 to the ground conductor 7.

The electrically conductive element 6 is embodied as an electrically conductive layer 18 arranged on a top side of the base 10. By way of example, the electrically conductive layer 18 is formed from a metal or a TCO, such as ITO (indium tin oxide). In the present case, the side surfaces of the volume region 3 and the adhesive surface 5 are free of the electrically conductive layer 18.

The base 10 has a significantly larger surface area than the rest of the stepped structure, such that in this way a very large part of the surface of the volume region 3 is covered with the electrically conductive layer 18.

A camera system 17 is arranged at the underside of the adhesive transfer stamp 1 and enables the semiconductor chip 2 on the adhesive surface 5 to be optically aligned with a mounting surface of a connection carrier. The optical alignment is possible, in particular, since the carrier 8 and the volume region 3 are embodied in transparent fashion and the electrically conductive layer 18 does not obstruct an optical path between the underside of the adhesive transfer stamp 1 and the adhesive surface 5.

Figure 2:
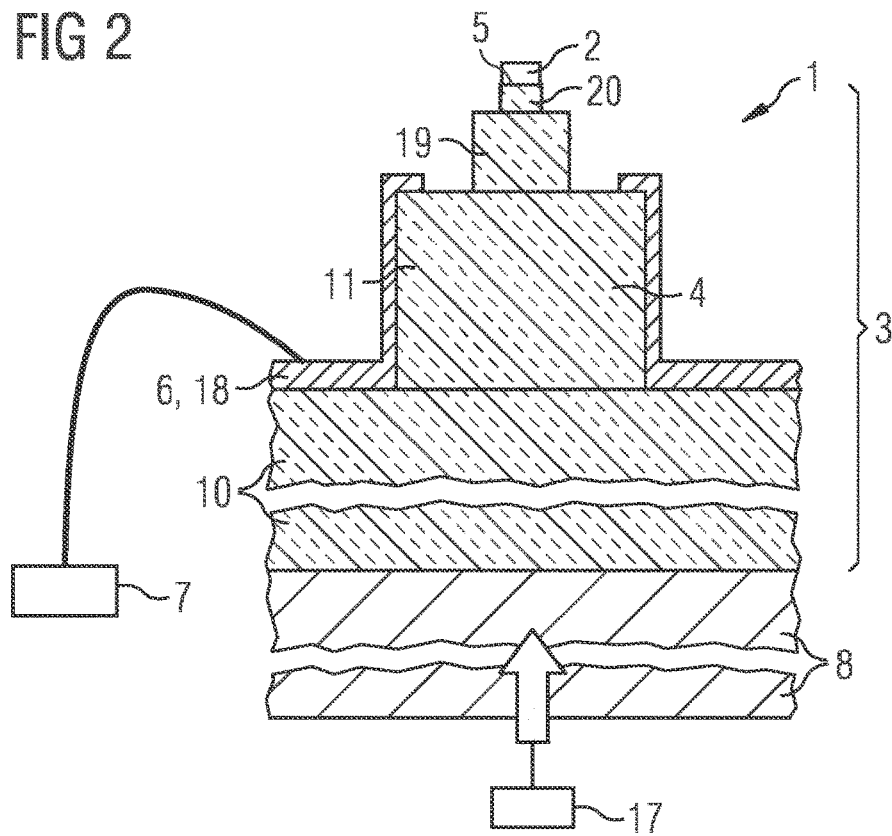

The exemplary embodiment illustrated in FIG. 2 differs from the exemplary embodiment illustrated in FIG. 1 in the arrangement of the electrically conductive layer 18. The electrically conductive layer 18 is applied to the top side of the base 10, as in the exemplary embodiment in FIG. 1, and furthermore to side surfaces of the first layer 11. Finally, the electrically conductive layer 18, proceeding from the side surface of the first layer 11, is partly also arranged on a top side of the first layer 11. This increases the area occupation of the electrically conductive layer 18, advantageously an optical alignment using a camera system 17 still being possible.

Figure 3:
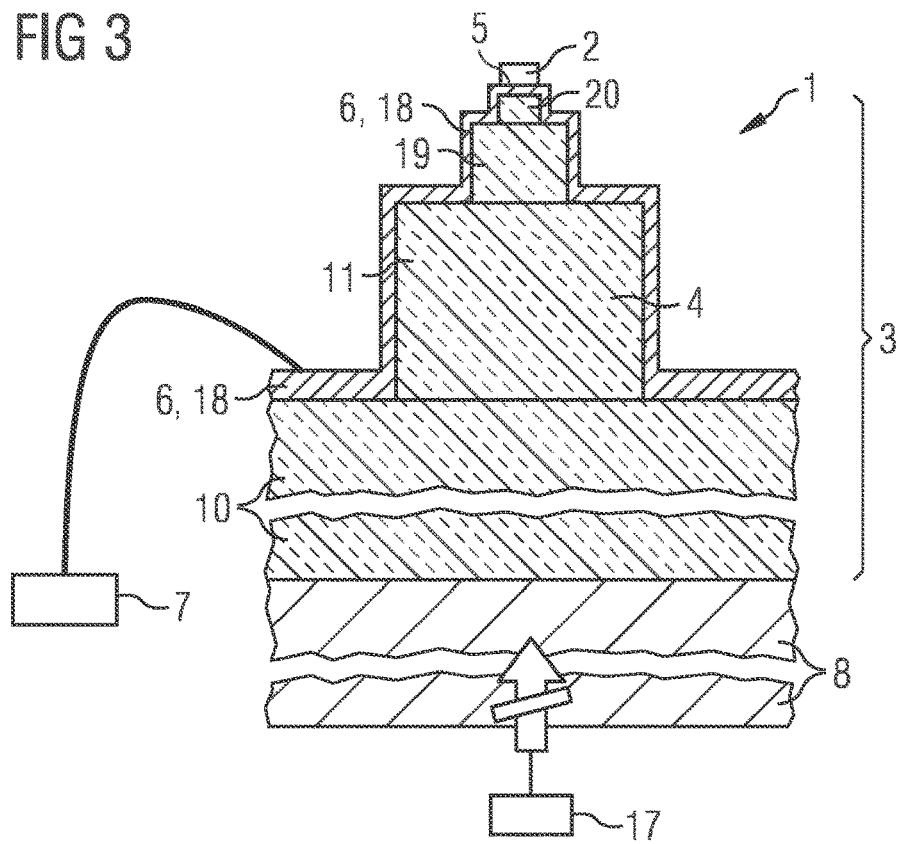

The exemplary embodiment illustrated in FIG. 3 differs from the exemplary embodiments illustrated in FIGS. 1 and 2 in the embodiment of the electrically conductive layer 18. In the present exemplary embodiment, the electrically conductive layer 18 is laminary arranged on the volume region 3. By way of example, the entire exposed outer surface of the volume region 3 is completely covered with the electrically conductive layer 18. In particular, in the present case, the adhesive surface 5 is formed by the electrically conductive layer 18. In the present case, the electrically conductive layer 18 is formed from titanium or gold, for example, and has a comparatively small thickness of approximately 100 nanometers.

Figure 4:
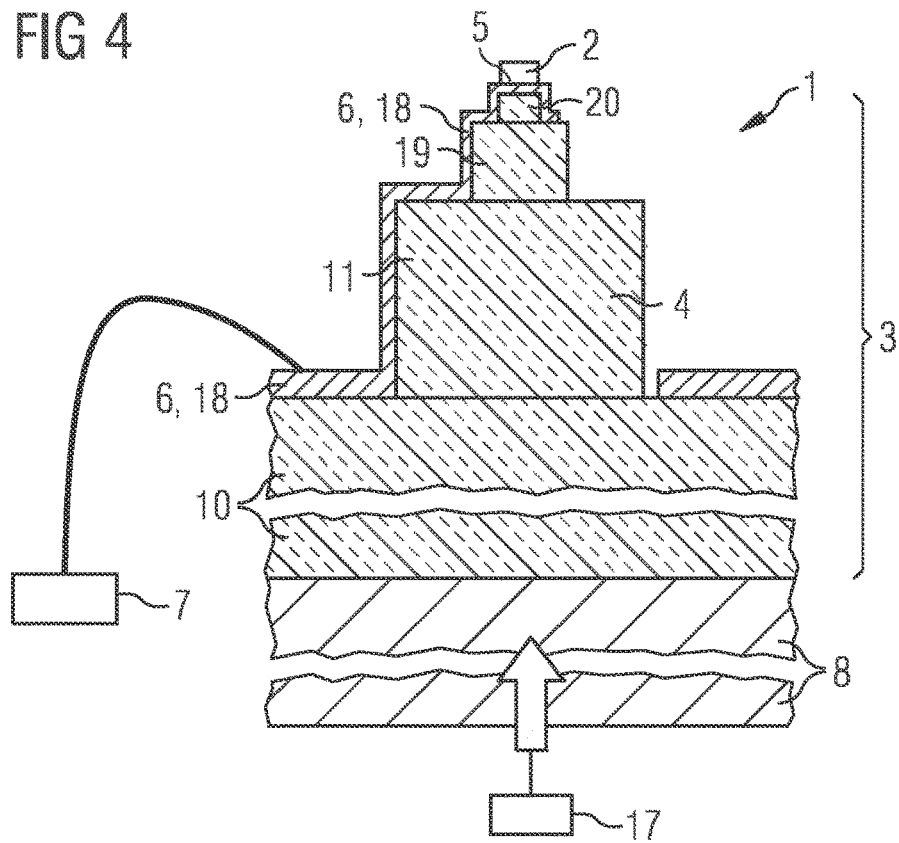

The exemplary embodiment illustrated in FIG. 4 also differs from those exemplary embodiments illustrated in FIGS. 1 to 3 in the arrangement of the electrically conductive layer 18.

In the present case, the adhesive transfer stamp has a rectangular basic shape. In other words, the adhesive surface 5 and the underside are embodied in rectangular fashion. In the present case, the volume region 3 also has a rectangular basic shape, such that the cross-sectional areas of the base 10, of the first layer 11, of the second layer 19 and of the third layer 20 are embodied in rectangular fashion. Moreover, in the present case, the volume region 3 has four side surfaces arranged between the underside and the adhesive surface 5.

The electrically conductive layer 18 is arranged on the top side of the base 10. The electrically conductive layer 18 is additionally arranged on one of the side surfaces of the volume region 3, specifically in a manner proceeding from the top side of the base 10 continuously as far as over a side surface of the third layer 20. The adhesive surface 5 is also formed by the electrically conductive layer 18 and additionally extends over a second side surface of the third layer 20 of the stepped structure. Consequently, only one of the four stepped sides is completely occupied by the electrically conductive layer 18. What is advantageously possible in this way is an optical alignment of the semiconductor chip 2 on the adhesive surface 5 with the aid of a camera system 17 at the underside of the adhesive transfer stamp 1 with at the same time high area occupation of the adhesive transfer stamp 1 with the electrically conductive layer 18.

Figure 5:
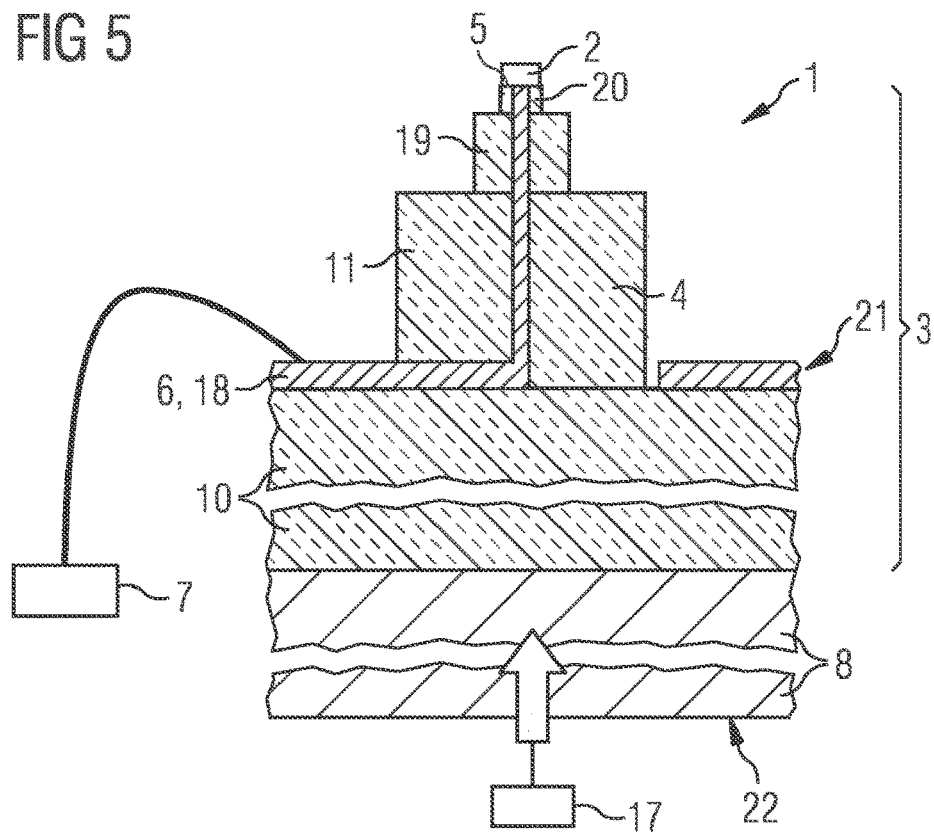

The exemplary embodiment illustrated in FIG. 5 also differs from those exemplary embodiments illustrated in FIGS. 1 to 4 in the arrangement of the electrically conductive layer 18. The electrically conductive layer 18 extends orthogonally from the top side of the base 10 to the adhesive surface 5 within the volume region 3 and furthermore at the top side of the base 10. The electrically conductive layer 18 runs through the first layer 11, second layer 19 and third layer 20. The rest of the volume region 3 of the adhesive transfer stamp 1 still comprises an electrically insulating material 4.

Figure 6:
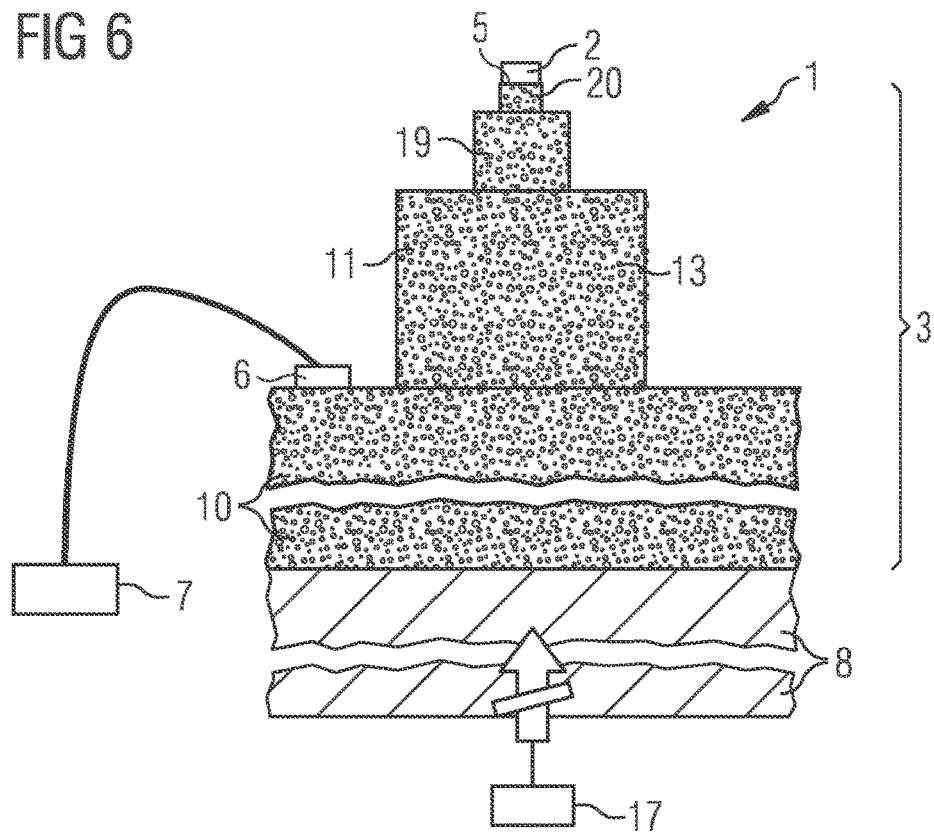

The exemplary embodiment illustrated in FIG. 6 differs from those exemplary embodiments illustrated in FIGS. 1 to 5 in the embodiment of the electrically conductive element 6. The volume region 3 of the adhesive transfer stamp 1 comprises an electrically insulating material 4, into which electrically conductive particles 13 are introduced. The base 10, the first layer 11, the second layer 19 and the third layer 20 thus comprise the electrically insulating material 4, into which electrically conductive particles 13 are introduced. The volume region 3 of the adhesive transfer stamp 1 is thus electrically conductive. Moreover, the adhesive transfer stamp 1 in accordance with the exemplary embodiment in FIG. 6 has an electrically conductive element 6 embodied as an electrical contact. The electrical contact is arranged on a top side of the base 10 and is electrically conductively connected to a ground conductor 7. Electrical charges flow via the electrically conductive particles 13 within the volume region 3 to the electrical contact and then to the ground conductor 7. Electrostatic charges that can damage the semiconductor chip 2 can be avoided or dissipated in this way.

Figure 7:
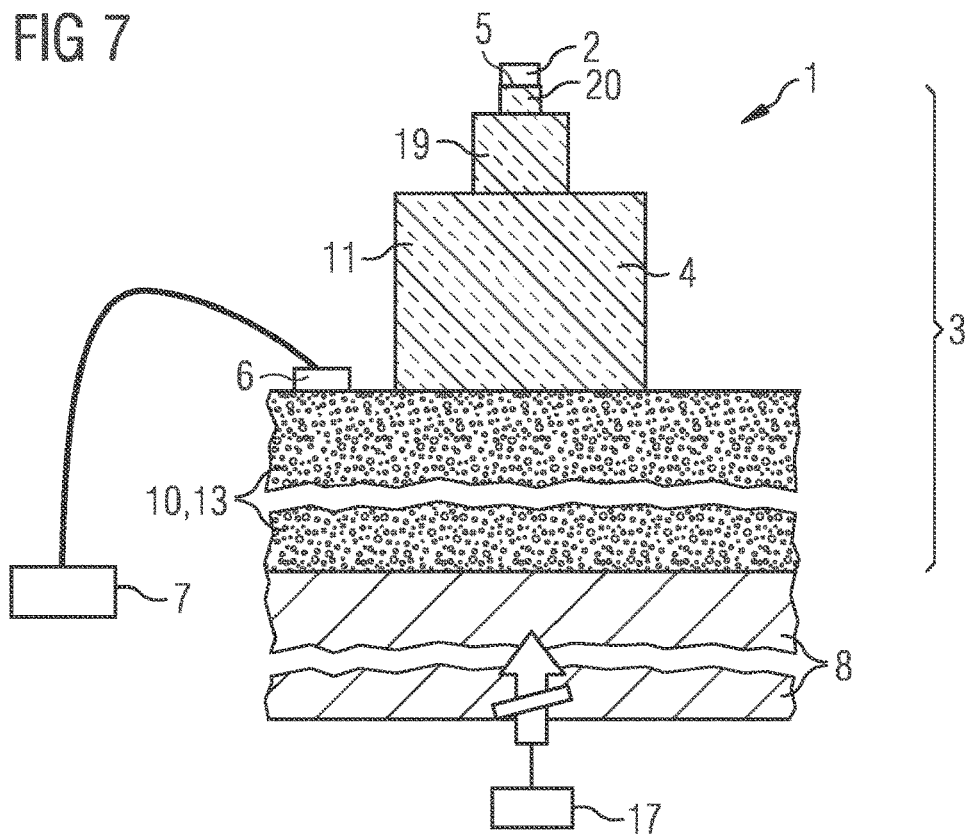

In the case of the adhesive transfer stamp 1 in accordance with the exemplary embodiment in FIG. 7, only the volume region 3 is provided with electrically conductive particles 13, while the first layer 11, the second layer 19 and the third layer 20 are free of electrically conductive particles 13 and are formed from the electrically conductive material. Once again an electrical contact is arranged on the top side of the base 10, and is electrically conductively connected to a ground conductor 7.

Figure 8:
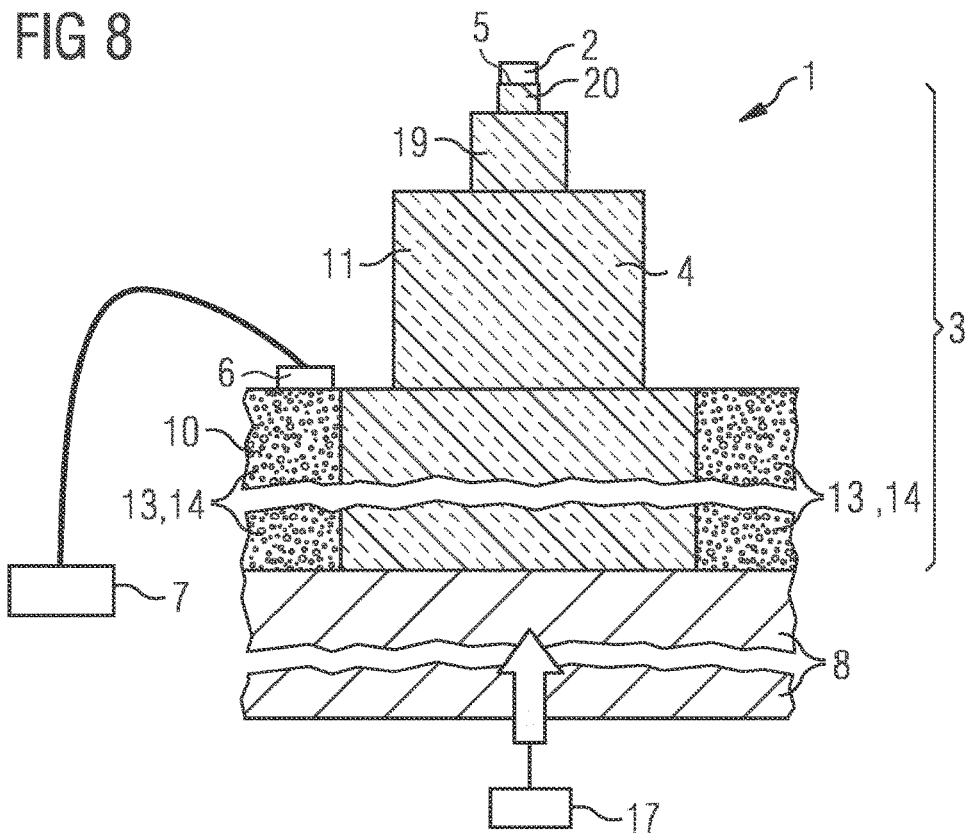

In the case of the adhesive transfer stamp 1 in accordance with the exemplary embodiment in FIG. 8, as in the exemplary embodiment in accordance with FIG. 7, only a part of the volume region 3 is provided with electrically conductive particles 13. In this case, the base 10 comprises the electrically insulating material 4, which is provided with electrically conductive particles 13 only in an edge region 14. The first layer 11, the second layer 19 and the third layer 20 of the volume region 3 are formed from the electrically insulating material 4.

In this case, the edge region 14 formed from an electrically insulating material 4, into which electrically conductive particles 13 are embedded, runs around a core of the base 10, which is embodied in electrically insulating fashion. In this case, the edge region 14 runs preferably completely around the core.

The adhesive transfer stamp 1 in accordance with the exemplary embodiment in FIG. 9 has an electrically conductive layer 18 formed from an electrically insulating material 4, into which electrically conductive particles 13 are introduced, in contrast to the adhesive transfer stamp 1 in accordance with the exemplary embodiment in FIG. 4.

The exemplary embodiment illustrated in FIG. 9 differs from those exemplary embodiments illustrated in FIGS. 1 to 8 in the embodiment of the electrically conductive element 6. In the present case, the electrically conductive element 6 is embodied as an electrically conductive layer 18. The electrically conductive layer 18 is formed from an electrically insulating material 4, such as has been described in association with the volume region 3, for example, which material is provided with electrically conductive particles 13. The electrically conductive layer 18 in accordance with the present exemplary embodiment is arranged on the volume region 3 in the same way as in the exemplary embodiment in FIG. 4.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An adhesive transfer stamp for transferring semiconductor chips, the adhesive transfer stamp comprising:
   a volume region comprising:
      an electrically insulating material; and
      at least one adhesive surface configured to receive a semiconductor chip; and
   an electrically conductive element configured to:
      electrically conductively connected to a ground conductor; and
      dissipate electrical charges from the semiconductor chip to the ground conductor,
   wherein the volume region is a solid body,
   wherein the volume region has at least one rim that is formed by at least one stepped structure with a first cross-sectional area that is wider than a second cross-sectional area located on top of the first cross-section area, and
   wherein the electrically conductive element is located at least at the rim.

2. The adhesive transfer stamp as claimed in claim 1, wherein the electrically conductive element comprises a transparent conductive oxide (TCO) or a metal.

3. The adhesive transfer stamp as claimed in claim 1, wherein the electrically insulating material comprises a transparent electrically insulating material.

4. The adhesive transfer stamp as claimed in claim 1, wherein the volume region is elastic.

5. The adhesive transfer stamp as claimed in claim 1, further comprising a carrier, on which the volume region is arranged.

6. The adhesive transfer stamp as claimed in claim 5, wherein the stepped structure comprises:
   a base having the first cross-sectional area; and
   a first layer having the second cross-sectional area that is smaller than the first cross-sectional area of the base.

7. The adhesive transfer stamp as claimed in claim 1, wherein the electrically conductive element is an electrically conductive layer arranged on a surface of the volume region.

8. The adhesive transfer stamp as claimed in claim 1, wherein the electrically conductive element is an electrically conductive layer arranged within the volume region.

9. The adhesive transfer stamp as claimed in claim 6, wherein the electrically conductive element is an electrical contact and the volume region comprises a plurality of electrically conductive particles.

10. The adhesive transfer stamp as claimed in claim 9, wherein the base comprises a plurality of electrically conductive particles.

11. The adhesive transfer stamp as claimed in claim 9, wherein the electrically conductive particles are contained only in parts of the volume region.

12. The adhesive transfer stamp as claimed in claim 11, wherein the base comprises a core, which is electrically insulating and which is surrounded by an edge region comprising a plurality of electrically conductive particles.

13. The adhesive transfer stamp as claimed in claim 1, wherein the adhesive transfer stamp has a plurality of adhesive surfaces arranged next to one another.

14. The adhesive transfer stamp as claimed in claim 1, wherein the adhesive transfer stamp has a plurality of stepped structures arranged next to one another.

15. A method for transferring the semiconductor chip, the method comprising:
adhesively attaching, using the adhesive transfer stamp of claim 1, the semiconductor chip to the adhesive surface of the adhesive transfer stamp;
positioning the semiconductor chip on an adhesive surface of a mounting surface of a connection carrier; and
releasing the adhesive transfer stamp from the semiconductor chip by shear forces.

16. The method as claimed in claim 15, wherein the semiconductor chip is adhesively attached to the adhesive surface by van der Waals forces.

17. The method as claimed in claim 15, further comprising positioning the semiconductor chip on the mounting surface with aid of a camera system with automatic image recognition.

18. The method as claimed in claim 15, wherein the semiconductor chip is released from the adhesive transfer stamp by being peeled off by shear movements so that the semiconductor chip stays on the mounting surface.

19. The adhesive transfer stamp claimed in claim 1, wherein step structure comprises a base, a first layer on top of the base, a second layer on top of the first layer and a third layer on top of the second layer, each with progressively smaller cross-sectional areas than the base and the layer on which they are respectively located.

* * * * *